United States Patent
Kawai

[11] Patent Number: 5,870,669
[45] Date of Patent: Feb. 9, 1999

[54] RADIO RECEIVER

[75] Inventor: Kazuo Kawai, Tokyo, Japan

[73] Assignee: General Research of Electronics, Inc., Tokyo, Japan

[21] Appl. No.: 674,960

[22] Filed: Jul. 2, 1996

[30] Foreign Application Priority Data

Mar. 18, 1996 [JP] Japan .................................. 8-088773

[51] Int. Cl.[6] .................................................. H04B 1/16
[52] U.S. Cl. ........................................... 435/209; 455/316
[58] Field of Search ................................ 455/209, 207, 455/313–316, 324; 375/324, 334; 329/302

[56] References Cited

U.S. PATENT DOCUMENTS

| | | | |
|---|---|---|---|
| 4,776,039 | 10/1988 | Akaiwa | 455/209 X |
| 4,944,025 | 7/1990 | Gehring et al. | 455/207 |
| 4,953,182 | 8/1990 | Chung | 375/344 |
| 5,081,650 | 1/1992 | Hasegawa et al. | 329/302 X |

*Primary Examiner*—Thomas J. Mullen, Jr.
*Attorney, Agent, or Firm*—Trexler, Bushnell, Giangiorgi & Blackstone, Ltd.

[57] ABSTRACT

A radio receiver which includes structure for direct-frequency-converting a received input signal to two axial base-band components including an in-phase base-band component and orthogonal phase base-band component. The radio receiver also includes structure for re-modulating the two axial base-band components of in-phase and orthogonal phase by using in-phase and orthogonal phase carrier waves where each carrier wave has a frequency equal to an IF signal frequency. Further, the radio receiver includes structure for composing the re-modulated components to provide the IF signal and for amplifying the IF signal, where the IF signal is an objective signal. The radio receiver further includes structure for detecting the objective signal to produce a detected output and for applying the detected output to a demodulated output terminal.

21 Claims, 1 Drawing Sheet

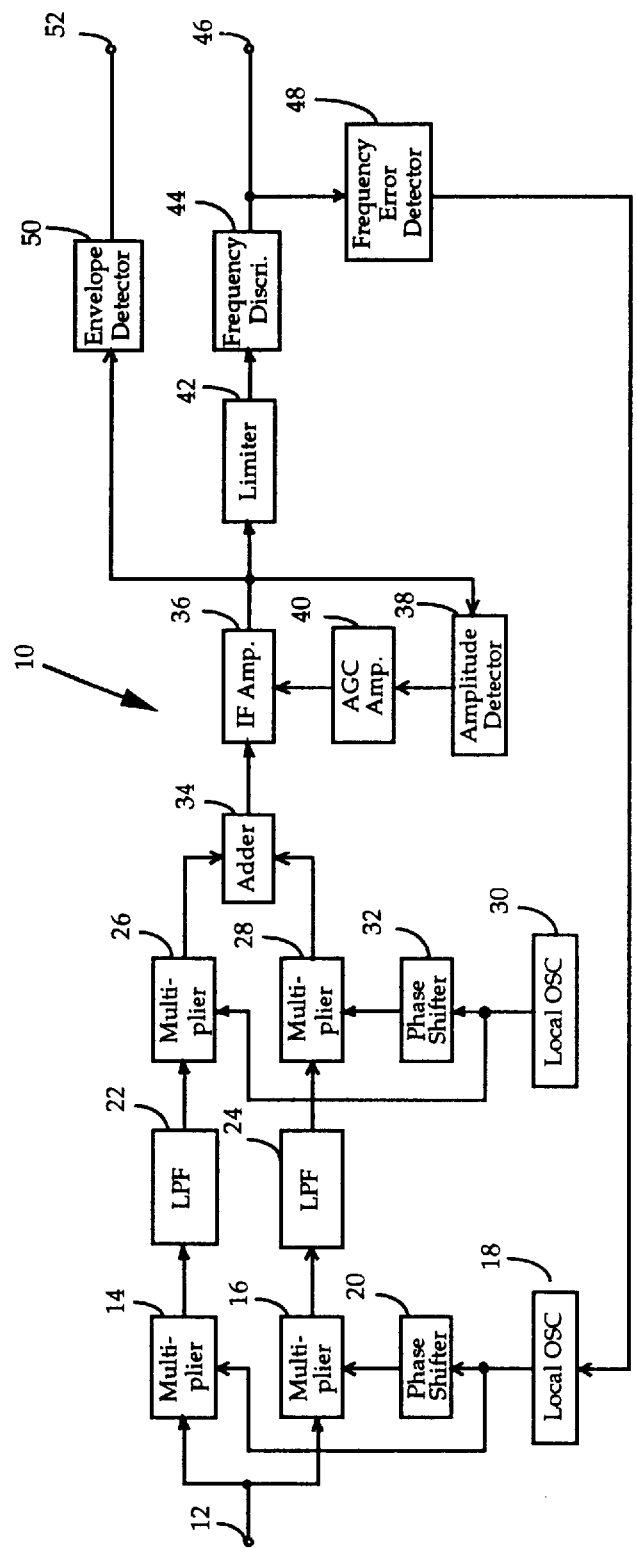

RADIO RECEIVER

FIELD OF THE INVENTION

This invention relates to a circuit constructing technique of a radio receiver circuit for receiving an AM (Amplitude Modulation) signal or an FM (Frequency Modulation) signal.

BACKGROUND OF THE INVENTION

Hitherto, as a method of constructing radio receivers, a heterodyne system or a direct conversion system has been used usually. In the heterodyne system, a high-frequency signal which was received by the receiver through an antenna is converted in frequency into an IF (Intermediate Frequency) signal using a super heterodyne system, and after the IF signal was amplified by an IF amplifier, it is detected to provide an audio signal. Whereas in the direct conversion system, the received high-frequency signal is converted directly to a base-band signal comprising two axial components of in-phase and orthogonal phase, and after the directly converted signal was amplified adequately, it is demodulated. The direct conversion system has the advantages that it can avoid image disturbance which would be produced in the heterodyne system and it can demodulate an FSK (Frequency Shift Keying) signal with a simple construction if a dedicated LSI (Large-Scale Integration) circuit is utilized. However, in order to demodulate the AM signal and the FM signal, a relatively complicated and specially designed circuit is needed in the direct conversion system, because for the demodulation of the AM signal $\sqrt{I^2+Q^2}$ should be obtained and for the demodulation of the FM signal I(dQ/dt)-Q(dI/dt)should be obtained (I and Q represent the two axial components of in-phase and orthogonal phase, respectively), and therefore respective amplifiers for these two axial components are required to have equal amplification degree and equal quantity of phase shift and also it is required to provide a differentiator with high precision. These requirements are not so strict to an amplifier and demodulator for the FSK signal because the FSK system only requires that information should be discriminated as two values (this means that the system can be constructed with an LSI). However, since a base-band amplifier for the FM signal is required to be considerably strict, an attempt to construct with an LSI an FM signal receiving circuit according to the direct conversion has not been put into practice up to now.

SUMMARY OF THE INVENTION

Therefore, this invention was created in view of the above-mentioned facts, and an object thereof is to provide a circuit constructing technique for a radio receiver which keeps intact the advantages of the direct conversion system in that it can avoid image disturbance, and further which can utilize various LSI circuits for IF amplification and demodulation which have been developed for the heterodyne system and are easily available in the market. Accordingly, in accordance with this invention, a radio receiver which has simple circuit construction and also is easy in demodulation can be provided.

In order to achieve the object described above and still others, the received input signal is first direct-frequency-converted to drop it to two axial (I-axis and Q-axis) base-band components of in-phase and orthogonal phase. At this stage, requisite selectivity is secured. Then, these base-band components are re-modulated and thereafter composed to provide a single IF signal. This IF signal is amplified by a required amplification degree.

Other objects, features and advantages of the invention will become apparent from a reading of the specification, when taken in conjunction with the drawings.

BRIEF DESCRIPTION OF THE DRAWINGS

A single FIGURE is a block diagram showing a radio receiver according to a preferred embodiment of this invention.

DESCRIPTION OF THE PREFERRED EMBODIMENT

Referring now to FIGURE, there is shown a block diagram of the main part of a radio receiver according to an embodiment of this invention, generally designated 10, which includes an input terminal 12 which is adapted to receive a high-frequency signal from a high-frequency circuit (not shown) of the receiver. The signal at the input terminal 12 is applied to first and second multipliers 14 and 16, respectively. The first multiplier 14 receives directly a signal from a first local oscillator 18, and the second multiplier 16 receives this signal through a phase shifter 20. In this embodiment, the signal generated by the first local oscillator 18 is a carrier wave of a frequency equal to the center frequency of the reception signal at the input terminal 12, and the phase shifter 20 shifts in phase by $\pi/2$ the carrier wave received from the first local oscillator 18. Therefore, the carrier wave from the phase shifter 20 has the orthogonal phase with respect to that of carrier wave from the first local oscillator 18. The first local oscillator 18 may be a voltage controlled oscillator (VCO).

Therefore, the first multiplier 14 multiplies the received signal at the input terminal 12 by the in-phase carrier wave from the first local oscillator 18, and the second multiplier 16 multiplies the received signal by the orthogonal phase carrier wave from the phase shifter 20. The outputs from the multipliers 14 and 16 are applied to low-pass filters 22 and 24, respectively, so that only a base-band component is outputted from the respective filter. The output of the filter 22 is the in-phase component and the output of the filter 24 is the orthogonal phase component. It is appreciated that as the low-pass filters 22 and 24 an active filter can be utilized so that requisite selectivity can be easily obtained, since the frequencies of the signals handled by them are low.

The outputs from the low-pass filters 22 and 24, that is two axial components are applied to third and fourth multipliers 26 and 28, respectively. The third multiplier 26 receives directly an output from a second local oscillator 30 and the fourth multiplier 28 receives an output from a phase shifter 32 which phase shifts $\pi/2$ the output from the second local oscillator 30. Therefore, the input to the third multiplier 26 from the second local oscillator 30 is an in-phase carrier wave and the input to the fourth multiplier 28 from the phase shifter 32 is an orthogonal phase carrier wave. The outputs of the third and fourth multipliers 26 and 28 are added to each other in an adder 34, so that an IF signal can be provided from the output of the adder 34, having its center frequency equal to the frequency of the local carrier wave from the second local oscillator 30. The frequency of this local carrier wave is selected so that the frequency of the resultant IF signal can be easily handled and adapted to subsequent amplification and demodulation. The second local oscillator may be an oscillator such as a X'tal oscillator which generates a fixed and predetermined frequency.

As is clear from the above explanation, since the in-phase component of the received signal detected on the basis of the first in-phase carrier wave from the first local oscillator 18 is superposed on the in-phase carrier wave referenced to the second local oscillator 30 output, and the orthogonal component of the received signal detected on the basis of the first orthogonal carrier wave is superposed on the orthogonal phase carrier wave also referenced to the second local oscillator 30 output, only the center frequency of the signal is converted keeping its side-band components left as they are. This means that the received signal which is indicated with polar coordinates is, once it has been converted to the one indicated with rectangular coordinates, again converted to one indicated with the polar coordinates. With such two stage frequency conversions, it becomes possible to provide the IF signal with no image disturbance. In the illustrated embodiment, a subtracter may be used in place of the adder 34. However, in such case, the IF signal having a vertically reversed spectrum is obtained.

The IF signal from the adder 34 thus converted can be amplified and modulated in accordance with various ways which are widely used at present, depending upon the objective modulation (AM or FM) signal. In the illustrated embodiment, the FM signal is amplified by the IF amplifier 36 which is automatic-gain-controlled by a conventional AGC loop including an amplitude detector 38 and an AGC amplifier 40. The amplified FM signal is amplitude limited by a limiter 42 in a well-known manner, and then frequency detected by a frequency discriminator 44. The detected output from the frequency discriminator 44 is applied to a demodulated output terminal 46 and also to a frequency error detector 48. The frequency error detector 48 detects any frequency error of the demodulated output and feeds it back to the first local oscillator 18 which may be the VCO to provide an AFC (Automatic Frequency Control).

In the case of the AM signal, the output of the IF amplifier 36 is applied to an envelope detector 50 to pick its envelope up. The output of the envelope detector 50 is applied to a demodulated output terminal 52.

For amplification and demodulation of these FM and AM IF signals, various LSI circuits have been developed up to now for the purpose of miniaturization and simplification. Therefore, in this invention, it is possible to merely apply these LSI circuits. Further, since the IF amplifier 36 can also have selectivity, the integrated selectivity of the whole system can be divided between the IF amplifier 36 and the low-pass filters 22 and 24.

As for the demodulation of the FSK signal, the output of the frequency discriminator 44 may be merely added to for example a comparator to convert it to a two-value signal, and therefore its detailed explanation is omitted herein.

Accordingly, as has been explained above, in accordance with this invention, it is possible for a receiver to be constructed so that it has the advantage according to the direct conversion system that there is no image disturbance, but it does not need two amplifier systems and a special demodulating circuit using the two axial signals, and it can utilize one system of the prior IF amplifier and demodulating circuit. Therefore, it is possible for the receiver to be constructed in a simple manner applying various LSI circuits which are available in the market.

While there has been shown and described a preferred embodiment, it is to be understood that various other adaptations and modifications may be made within the spirit and scope of the invention.

What is claimed is:

1. A radio receiver comprising:
   means for direct-frequency-converting a received input signal to two axial base-band components comprising an in-phase base-band component and orthogonal phase base-band component;
   means for re-modulating said two axial base-band components of in-phase and orthogonal phase by using in-phase and orthogonal phase carrier waves, each said carrier wave having a frequency equal to an IF signal frequency;
   means for composing the re-modulated components to provide the IF signal;
   means for amplifying said IF signal, said IF signal being an objective signal;
   means for detecting said objective signal to produce a detected output; and
   means for applying said detected output to a demodulated output terminal.

2. The radio receiver as claimed in claim 1 wherein said IF signal is an AM objective signal.

3. The radio receiver as claimed in claim 1 wherein said IF signal is an FM objective signal.

4. The radio receiver as claimed in claim 1 wherein said IF signal is an FSK objective signal.

5. The radio receiver as claimed in claim 1 wherein said direct-frequency-converting means includes first and second multipliers for converting the frequency of the received input signal to the frequency of said two axial base-band components of in-phase and orthogonal phase, respectively, means for generating two first local carrier waves of inphase and orthogonal phase having their frequency equal to that of the received input signal, said two first local carrier waves of in-phase and orthogonal phase being applied to said first and second multipliers, respectively, and first and second low-pass filters coupled to the outputs of said first and second multipliers, respectively, and for providing said two axial base-band components of in-phase and orthogonal phase.

6. The radio receiver as claimed in claim 5 wherein said means for generating two first local carrier waves comprises a first local oscillator for generating the first local carrier wave of in-phase and a phase shifter coupled to receive the first local carrier wave of in-phase and for providing the first local carrier wave of orthogonal phase.

7. The radio receiver as claimed in claim 6 wherein said first local oscillator comprises a VCO.

8. The radio receiver as claimed in claim 5 wherein said first and second low-pass filters comprises active filters.

9. The radio receiver as claimed in claim 1 wherein said re-modulating means comprises means for generating two second local carrier waves of in-phase and orthogonal phase having their frequency equal to said IF signal frequency, and third and fourth multipliers for receiving said two axial base-band components of in-phase and orthogonal phase, respectively, and multiplying said two axial base-band components of in-phase and orthogonal phase by said two second local carrier waves of in-phase and orthogonal phase, respectively.

10. The radio receiver as claimed in claim 9 wherein said means for generating two second local carrier waves comprises a second local oscillator for generating the second local carrier wave of in-phase and a phase shifter coupled to receive the second local carrier wave of in-phase and for providing the second local carrier wave of orthogonal phase.

11. The radio receiver as claimed in claim 10 wherein said second local oscillator comprises a fixed frequency oscillator.

12. The radio receiver as claimed in claim 1 wherein said composing means comprises an adder.

13. The radio receiver as claimed in claim 1 wherein said composing means comprises a subtracter.

14. The radio receiver as claimed in claim 1 wherein an output of said IF signal amplifying means is in communication with an AGC loop which is connected directly to an input of said IF signal amplifying means.

15. The radio receiver as claimed in claim 1, wherein said means for composing comprises an adder for receiving said remodulated components and providing said IF signal, wherein said means for amplifying comprises an amplifier connected to said adder, wherein said means for detecting comprises a limiter connected to said amplifier and a frequency discriminator connected to said limiter to produce a detected output, and wherein said demodulated output terminal is in communication with said frequency discriminator for receiving said detected output therefrom.

16. The radio receiver as claimed in claim 1, wherein said means for amplifying comprises an amplifier connected to said composing means, wherein said means for detecting comprises an envelope detector connected to said amplifier to pick an envelope up and provide an output signal, and wherein said demodulated output terminal is in communication with said envelope detector for receiving said detected output therefrom.

17. A method for the direct conversion of an input signal comprising the steps of:
    direct-frequency-converting said input signal into two axial base-band components comprising an in-phase base-band component and orthogonal phase base-band component;
    remodulating said two axial base-band components of in-phase and orthogonal phase using respective in-phase and orthogonal carrier waves, each said carrier wave having a frequency equal to an IF signal frequency;
    composing said remodulated components to provide said IF signal;
    demodulating said IF signal, wherein said step of composing includes providing an adder and applying said remodulated components to said adder providing said IF signal;
    amplifying said IF signal, said IF signal being an FM objective signal;
    limiting the amplitude of said FM signal;
    detecting said FM signal with a frequency discriminator to produce a detected output; and
    applying said detected output to a demodulated output terminal.

18. The method as defined in claim 17, further comprising the step of:
    applying said amplified IF signal to an automatic gain control loop for controlling the amplification of said IF signal.

19. A method for the direct conversion of an input signal comprising the steps of:
    direct-frequency-converting said input signal into two axial base-band components comprising an in-phase base-band component and orthogonal phase base-band component;
    remodulating said two axial base-band components of in-phase and orthogonal phase using respective in-phase and orthogonal carrier waves, each said carrier wave having a frequency equal to an IF signal frequency;
    composing said remodulated components to provide said IF signal;
    demodulating said IF signal, wherein said step of composing includes providing an adder and applying said remodulated components to said adder providing said IF signal;
    amplifying said IF signal, said IF signal being an AM objective signal;
    applying said AM signal to an envelope detector to pick an envelope up providing an output signal; and
    applying said output signal to a demodulated output terminal.

20. A radio receiver comprising:
    means for direct-frequency-converting a received input signal to two axial base-band components;
    means for modulating said two axial base-band components by using carrier waves having a frequency equal to an IF signal frequency;
    means for composing the modulated components to provide the IF signal;
    means for amplifying said IF signal;
    means for detecting said objective signal to produce a detected output; and
    means for applying said detected output to a demodulated output terminal.

21. The radio receiver as claimed in claim 20, wherein said means for composing comprises an adder for receiving said remodulated components and providing said IF signal, wherein said means for amplifying comprises an amplifier connected to said adder, wherein said means for detecting comprises a limiter connected to said amplifier and a frequency discriminator connected to said limiter to produce a detected output, and wherein said demodulated output terminal is in communication with said frequency discriminator for receiving said detected output therefrom.

* * * * *